(12) United States Patent
Keigler et al.

(10) Patent No.: US 9,714,474 B2
(45) Date of Patent: Jul. 25, 2017

(54) SEED LAYER DEPOSITION IN MICROSCALE FEATURES

(75) Inventors: Arthur Keigler, Wellesley, MA (US);
Johannes Chiu, Chelsea, MA (US);
Zhenqiu Liu, Northboro, MA (US);
Daniel Goodman, Lexington, MA (US)

(73) Assignee: TEL NEXX, INC., Billerica, MA (US)

( * ) Notice: Subject to any disclaimer, the term of this patent is extended or adjusted under 35 U.S.C. 154(b) by 1292 days.

(21) Appl. No.: 12/755,198

(22) Filed: Apr. 6, 2010

(65) Prior Publication Data

US 2011/0240481 A1    Oct. 6, 2011

(51) Int. Cl.
*C25D 7/12*      (2006.01)
*H01L 21/288*    (2006.01)
(Continued)

(52) U.S. Cl.
CPC ........... *C25D 7/123* (2013.01); *C25D 17/001* (2013.01); *H01L 21/2885* (2013.01);
(Continued)

(58) Field of Classification Search
CPC ..................................................... C25D 7/123
(Continued)

(56) References Cited

U.S. PATENT DOCUMENTS 3,684,666 A    8/1972    Shaw
5,246,565 A    9/1993    Mignardot
(Continued)

OTHER PUBLICATIONS

U.S. Office Action mailed Sep. 9, 2015 in co-pending Continuation-In-Part U.S. Appl. No. 13/833,983, filed Mar. 15, 2013. (31 pages).
(Continued)

*Primary Examiner* — James Lin
*Assistant Examiner* — Ho-Sung Chung
(74) *Attorney, Agent, or Firm* — Rothwell, Figg, Ernst & Manbeck, P.C.

(57) ABSTRACT

A method and system for coating the interior surfaces of microscale hole features fabricated into the substantially planar surface of a work piece. The method comprises providing a work piece with a barrier metal coating that is substantially continuous and uniform both along the planar surface of the work piece and the inner surfaces of the microscale hole features wherein said barrier metal coating is applied by a substantially surface reaction limited process. The workpiece is provided with a coating, on the planar surface of the work piece, of a thick metal layer anchored to the barrier metal coat and disposed to provide substantially uniform electrical conduction capability to the microscale features located throughout and across the workpiece. An electrical contact path is provided to the electrically conductive coating at the perimeter of the work piece. The workpiece is immersed in a chemical bath, causing said chemical bath to fully contact the interior surfaces of the microscale hole features, said chemical bath containing metal ions suitable for electrodeposition. An electric potential is applied at the perimeter of the work piece to cause electrodeposition of metal ions onto all surfaces of the work piece including the interior surfaces of the microscale hole features to a predetermined finish coating in one step.

5 Claims, 6 Drawing Sheets

(51) Int. Cl.
*H01L 21/768* (2006.01)
*C25D 17/00* (2006.01)

(52) U.S. Cl.
CPC .. *H01L 21/76873* (2013.01); *H01L 21/76898* (2013.01); *H01L 2221/1089* (2013.01)

(58) Field of Classification Search
USPC ......... 205/123, 183; 438/674, 677, 678, 687
See application file for complete search history.

(56) References Cited

U.S. PATENT DOCUMENTS

| | | | |
|---|---|---|---|
| 5,597,412 A * | 1/1997 | Grilletto et al. | 118/50 |
| 6,136,707 A * | 10/2000 | Cohen | 438/687 |
| 6,497,801 B1 | 12/2002 | Woodruff et al. | |
| 6,518,184 B1 * | 2/2003 | Chambers et al. | 438/687 |
| 6,660,153 B2 | 12/2003 | Merricks et al. | |
| 6,773,571 B1 | 8/2004 | Mayer et al. | |
| 6,861,355 B2 * | 3/2005 | Marsh | 438/652 |
| 6,881,318 B2 * | 4/2005 | Hey et al. | 205/87 |
| 6,919,013 B2 | 7/2005 | Chen | |
| 7,041,595 B2 | 5/2006 | Chopra | |
| 7,115,196 B2 | 10/2006 | Chen et al. | |
| 2002/0146853 A1 | 10/2002 | Karpov et al. | |
| 2004/0188260 A1 * | 9/2004 | Bonkabeta et al. | 205/102 |
| 2005/0167275 A1 | 8/2005 | Keigler et al. | |
| 2005/0173252 A1 * | 8/2005 | Chen | 205/157 |
| 2005/0199502 A1 | 9/2005 | Andricacos et al. | |
| 2006/0084264 A1 * | 4/2006 | Baskaran et al. | 438/652 |
| 2006/0163055 A1 | 7/2006 | Vereecken et al. | |
| 2006/0289999 A1 * | 12/2006 | Lee et al. | 257/762 |
| 2008/0111237 A1 | 5/2008 | Leavy et al. | |
| 2008/0149490 A1 * | 6/2008 | Bonhote et al. | 205/183 |
| 2009/0051036 A1 * | 2/2009 | Abbott | 257/762 |

OTHER PUBLICATIONS

Office Action mailed Oct. 7, 2015 in corresponding Taiwan Patent Application No. 100111476 (with an English translation) (8 pages).

* cited by examiner

SEED LAYER DEPOSITION IN MICROSCALE FEATURES

FIELD

The disclosed embodiments relate generally to a method and apparatus for fluid processing a workpiece, and more particularly to a method and apparatus for depositing a metal into micro-scale recesses in the surface of a workpiece coated with a high resistivity metal film, and more particularly to a method and apparatus for coating the interior surfaces of through-silicon-via (TSV) features with copper after said surfaces have been coated with a barrier metal.

BACKGROUND

Through silicon via (TSV) structures have recently been developed as a method to produce three dimensional (3D) electronic integrated devices. These TSV structures entail forming a metal plug inside a small hole in the silicon or other substrate material, wherein the typical hole size may be from about 1 to 30 microns in diameter and from 10 to 250 microns in depth. To fabricate a TSV structure, holes are first etched into the silicon or substrate material, the hole(s) are coated with an insulating material, silicon dioxide for example, which is then covered with a barrier material such as titanium, tantalum, or their nitrides, titanium nitride or tantalum nitride, for example, and the hole is then filled with a conductive material, copper for example. A conventional means of filling the TSV with copper is to use electroplating using one of various means to cause the electroplating to deposit copper preferentially near the bottom of the hole and cause the copper to deposit more inside the via then on the flat surface, or field, of the silicon substrate; this is the well known bottoms-up copper damascene filling electroplating process method. To enable this conventional method it is necessary to form a plating seed layer on which to grow the electroplated film, typically the seed layer is of the same material as the electroplated filling step material, typically both are copper, and the copper plating seed layer is conventionally formed by physical vapor deposition (PVD). A difficulty in conventional methods using PVD metal layers in the case of high aspect ratio TSV structures (compared to damascene structures) is that very little if any of the physical vapor deposited metal coats the interior surfaces of the TSV hole, and therefore an incomplete and inadequate barrier and seed metal layers form in those regions. This disadvantage of PVD increases as the depth to diameter (i.e. aspect) ratio of the TSV increases because of the ballistic transport nature of PVD, this will be discussed in more detail below with reference to prior art.

To achieve the commercial and reliability benefits of three dimensional IC fabrication it is advantageous to fabricate the TSV holes with a high ratio of depth to diameter, aspect ratios of 10 or more are advantageous. Alternate means of conventionally depositing the metal layers into the high aspect ratio TSV feature are atomic layer deposition (ALD) or chemical vapor deposition (CVD). ALD deposits metal films one atomic layer after another through a series of surface limited reactions which are virtually independent of the microscale geometry of surface and hence provides a technically ideal means of coating TSV interior features with metal layers, however the ALD process is slow and therefore commercially too uneconomical for many production TSV applications. CVD is a well known and commercially economical means of depositing TiN, TaN, or W barrier metals into high aspect ratio holes however it has been found to be uneconomical for copper, or other seed layer metals, due to the instability and expense of the metal-organic precursor materials. Conventional wet processes, such as electrochemical deposition (ECD) and electroless metal deposition have also shown to be deficient in commercial fabrication of microscale structures. In the case of electroless metal deposition, a chemical potential may be caused by reaction of the fluid borne reactants and catalytic species on the TSV interior surface. Electroless metal deposition requires a series of chemical pre-treatments in order to set-up the reaction potential between the barrier metal and the seed metal reactants, and the chemical constituents of the pre-treatment and deposition chemical baths must be tightly controlled, all of which can make the electroless metal process expensive and difficult to operate. The alternative conventional wet process method, conventional ECD, suffers from other deficiencies that render it also not production worthy. For example, a significant difficulty of using conventional means for ECD to deposit seed metal on the interior surfaces of TSV features of a substrate coated with highly resistive barrier metal, for example a TiN with resistivity of 10 to 100 ohms/square, is the large radial electrical potential drop that occurs within the barrier metal as current flows from the substrate perimeter to the substrate center, this large potential drop causes an undesirable difference in the available driving electrical potential between edge and center regions of the substrate. Electrical contact to the substrate is formed at the substrate edge and the circuit is completed through the barrier metal and into the electrochemical bath. Consequently a highly resistive metal layer causes a significant voltage drop from edge to center of substrate. A conventional means of overcoming this difficulty of conventional ECD is addressed by Andricacos in U.S. Pat. Pub. No. 2005/0199502, U.S. application Ser. No. 11/123,117, wherein a method of causing the deposition front to proceed from substrate edge to substrate center by using chemical additives to block further deposition on the copper seed metal and thereby causing preferential deposition on the uncovered region of barrier metal while using the deposited copper as an advancing electrical conduction layer. A potential difficulty with this method is controlling the chemical additive concentrations in the appropriate ranges to cause sufficient nucleation potential difference between the barrier metal and the copper metal surfaces. Therefore conventional methods and apparatus have proven inadequate for fabrication of TSV structures.

BRIEF DESCRIPTION OF THE DRAWINGS

The advantages of the technology described above, together with further advantages, may be better understood by referring to the following description taken in conjunction with the accompanying drawings. In the drawings, like reference characters generally refer to the same parts throughout the different views. The drawings are not necessarily to scale, emphasis instead generally being placed upon illustrating the principles of the technology.

DETAILED DESCRIPTION OF THE DISCLOSED EMBODIMENTS

Figure 1A:
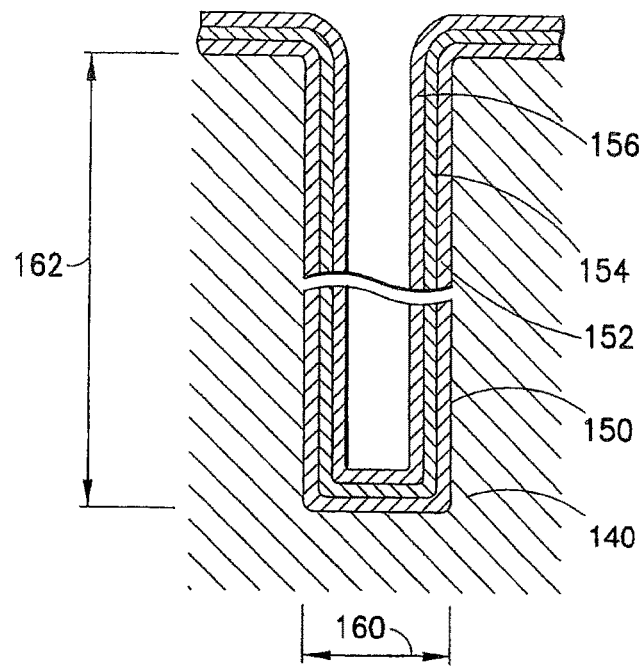
FIG. 1A-1C depicts cross sectional view of a microscale feature at different stages of fabrication in a conventional manner.

Although the present invention will be described with reference to the embodiments shown in the drawings, it should be understood that the present invention can be embodied in many alternate forms of embodiments. In addition, any suitable size, shape or type of elements or materials could be used.

Wet processing provides an attractive means for transporting reactants to the interior surfaces of TSV structures because the fluid transport at this feature scale is primarily through diffusion and is therefore significantly less restricted by the high aspect ratio geometry than is PVD. In order to effect wet processing of the TSV structures, it is desirable to provide a means for completely wetting the interior TSV surfaces, in other words providing a means for replacing the barrier metal/air interface with a barrier metal/fluid interface, and an advantageous embodiment for this method and apparatus is described in U.S. Pat. App. 61/151,385 by Keigler which is hereby incorporated by reference herein in its entirety. After fluid is fully in contact with all elements of the interior TSV surface it is possible to transfer reactants to these surfaces via diffusive transport. By also providing a suitable electrical driving potential it is possible to cause an electrochemical reaction and transform reactants in the fluid into a metal deposit layer metal on the TSV interior surface. However, as noted before, a significant difficulty of using conventional ECD to deposit seed metal on the interior surfaces of TSV features of a substrate coated with highly resistive barrier metal (e.g. TiN with resistivity of about 10-100 ohms/square) is the large radial electrical potential drop that occurs within the barrier metal as current flows from the substrate perimeter to the substrate center. The large potential drop causes an undesirable difference in the available driving electrical potential between edge and center regions of the substrate. The disclosed embodiments overcome the problems of conventional deposition means, as will be described further below, to provide locally on the TSV interior surface an adequate electrical potential to cause suitable electrodeposition of metal to locally form a plating seed layer.

A desired characteristic of a seed or conductivity layer to be used, as will be described further below, for subsequent filling of TSV structures, is that said layer is adhered sufficiently well to the planar surface of the substrate to endure the applied stress of a relatively thick, 1 to 5 micron, copper layer which is formed on the planar surface during the TSV filling process, and which must endure the mechanical stresses of chemical mechanical polishing which is typically done after the TSV filling step. Adhesion of an electrodeposited metal film is strongly dependent on the nucleation density which depends on the local deposition overpotential as well as plating chemistry characteristics. Conventional methods for "direct on barrier" or "seed layer repair" electrodeposition (e.g. as disclosed in U.S. Pat. No. 7,247,223) involve costly complex equipment for electrodeposition to provide a minimum of overpotential variation across the substrate and may require an anneal step after the seed layer electrodeposition to improve the adhesion prior to the filling step. In contrast to conventional methods, the exemplary embodiments produce an economical method to provide reliable adhesion of seed layer without recourse to an anneal step and to provide better overpotential uniformity across the substrate to achieve repeatable adhesion and grain structure among all TSVs on the substrate as will described in greater detail below.

The exemplary embodiments, as will be described below in various aspects, provide a method, systems and components for processing one or more workpieces by the formation of metal seed layers in the interior surfaces of through silicon via features on the surfaces of the workpiece(s). A workpiece can be planar or substantially planar, and can be thin or ultra-thin. Suitable workpieces include, but are not limited to, semiconductor wafers, silicon workpieces, interconnection substrates, and printed circuit boards.

First, microscale holes are formed in the workpiece by well known etching processes, and suitable isolation and barrier films are applied to the workpiece, both on the planar surface as well as the interior surfaces of the micro-scale vias, in particular a tungsten, titanium-nitride or tantalum nitride barrier layer of from 200 to 500 angstroms in thickness is applied with chemical vapor deposition, this barrier film providing the substrate with a surface conductivity of between 10 and 200 ohms/square. The disclosed embodiments provides a means of electrically connecting the plurality of microscale via features to the perimeter of the wafer by then applying with physical vapor deposition (PVD) a combined layer of adhesion promoting film such as titanium in the range of 200 to 500 angstroms in thickness followed by a substantially conductive layer film such as copper in the range of 1000 to 3000 angstroms in thickness (e.g. what may be referred to as a thick layer). In the exemplary embodiments the PVD process may not cause substantial or appreciable seed metal deposition within the microscale via feature. However the PVD process does provide reliable adhesion between the Ti/Cu layer and the planar surface of the substrate, thereby anchoring the conductive layer to the barrier layer and the substrate surface. This well adhered substantially conductive Ti/Cu layer provides a path to apply electric potential to the interior surfaces of all the microscale vias.

The substrate with microscale vias may be immersed in a processing fluid using a means to ensure complete elimination of air to metal surface interfaces within said micro-scale via and their replacement with fluid to metal surface interfaces; for example by using a vacuum pre-wet method as disclosed in U.S. Pat. App. 61/151,385 by Keigler which is hereby incorporated by reference herein in its entirety. Fluid may be de-ionized and de-aerated water, or it may be a water containing 0.5% by weight hydrofluoric acid. The wetting fluid may be removed and replaced with a copper electroplating solution. This may be accomplished while maintaining the wafer within a substantially oxygen free environment. This may be accomplished, for example, by pushing the fluid from the vacuum pre-wet vessel using an oxygen free gas such as nitrogen and replacing the new fluid by pumping out the nitrogen and resuming the vacuum environment. At this point the microscale vias contain copper electroplating solution. The top most portion of the sidewall of the microscale vias may be electrically connected to the wafer perimeter via the PVD Ti/Cu conductive layer that is connected to a power supply and an anode disposed substantially parallel to the wafer surface. A series of short pulses of negative electrical potential may be applied between the interconnected microscale via array and the anode. The duration of each pulse causes the copper ions immediately adjacent to the wafer surface interface to electro-deposit, within the microscale via, copper deposits on the metal barrier surface and on the planar field region copper deposits on the PVD copper surface. A delay between pulses may be provided to allow diffusion of copper ions from the bulk solution and replace those removed from the near surface region. By way of example, a ratio of about 2:10 between the off/on times has been found to be advantageous though any other suitable off/on cycle ratios may be used. The present disclosed embodiments overcome the problems of conventional means for example, by using what may be referred to as a relatively thick, substantially uniform and conductive PVD copper layer rather than a conventional ultra thin discontinuous PVD copper seed layer. This substantially uniform and continuous conductive layer may interconnect substantially all the micro-scale vias (and more specifically the topmost portion of the via side walls). Copper may be directly deposited in the exemplary embodiments, on the barrier metal exposed on the walls of the microscale vias, which eliminates problems encountered by conventional means in repairing thin PVD copper layer or depositing copper directly on barrier metal covering the full wafer surface. The present disclosed embodiments further eliminate; the difficulty encountered by conventional means (using an ultra-thin seed layer) of electro-depositing onto a highly resistive substrate, the need for costly ionized PVD deposition equipment, and minimize the uncertainty about achieving void free filing among all vias on the substrate.

In greater detail now, the present disclosed embodiments provide a novel system and method of producing an electroplating seed layer on the high resistivity barrier layer interior surfaces of a plurality of microscale holes on a workpiece. In particular, the system and method of the exemplary embodiments provide the seed layer inside a high aspect ratio through-silicon-via (TSV) and then electrofill the TSV with copper. The present disclosed embodiments avoid the limitations of conventional methods which entail deposition on a high resistivity substrate, either because said methods utilize deposition directly on high resistivity barrier layer, or utilize an ultra-thin metal seed layer on top of the high resistivity barrier layer, and therefore require using a conventional electroplating cell that employs multiple anodes.

Prior-art method as disclosed by U.S. Pat. No. 7,115,196 which is hereby incorporated by reference herein in its entirety is briefly described herein with reference to FIG. 1A which shows a cross sectional view of a microscale feature such as a TSV. A plurality of holes 150 are etched in the substrate 140, said substrate and holes may then be coated with an insulating film (not shown) and then coated with a high resistivity barrier metal layer 152, this coating may be deposited by a vapor deposition process such as plasma vapor deposition (PVD) or by chemical vapor deposition (CVD). The conventional purpose of the barrier metal layer is to prohibit diffusion of metal atoms, typically copper atoms, from the interior of the TSV into the substrate 140. An ultra-thin metal seed layer 154 is then deposited on top of said barrier layer 152. This may be deposited using a chemical reaction, such as electroless nickel deposition, or it may be deposited using plasma vapor deposition (PVD) in the same machine used for depositing the barrier layer. Finally, prior-art typically involves using a complex electrodeposition apparatus for the purpose of enhancing an ultra-thin metal seed layer, an apparatus such as described in U.S. Pat. No. 7,115,196 which is hereby incorporated by reference herein in its entirety. Using such an apparatus, the prior-art adds more seed layer metal to the ultra-thin seed layer so that it is continuous enough to provide for good electro-deposition of the filling metal, typically copper, 158 during the subsequent electro-deposition process step.

Figure 1B:
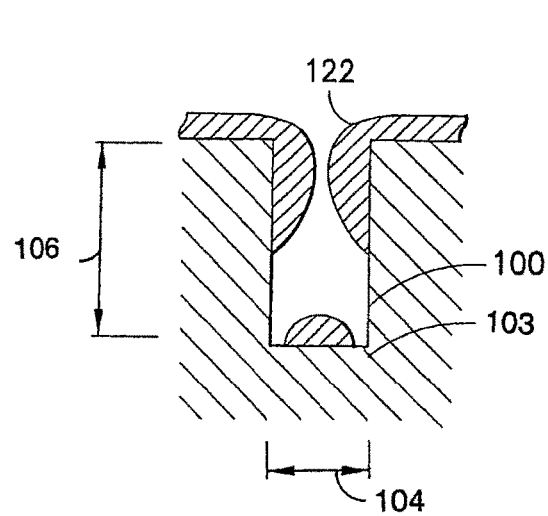
Figure 1C:
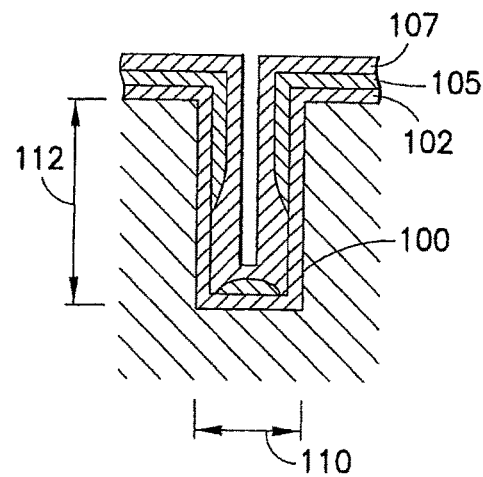
Figure 2:
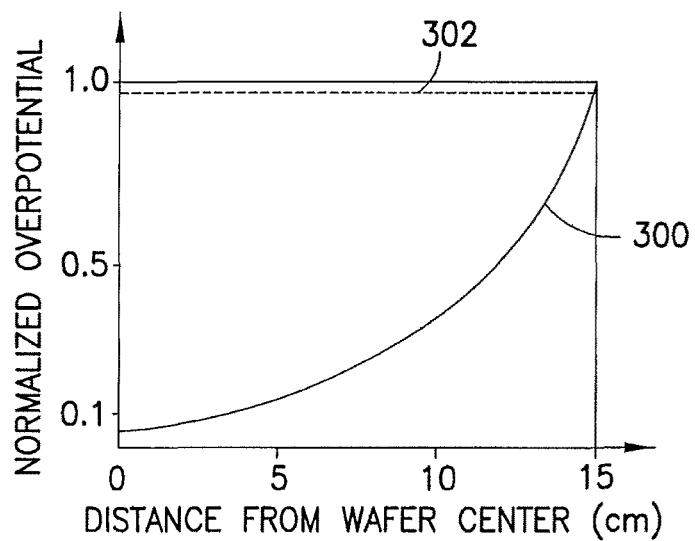
FIG. 2 depicts the normalized deposition over potential as a function of position on a wafer or workpiece.
Figure 6:
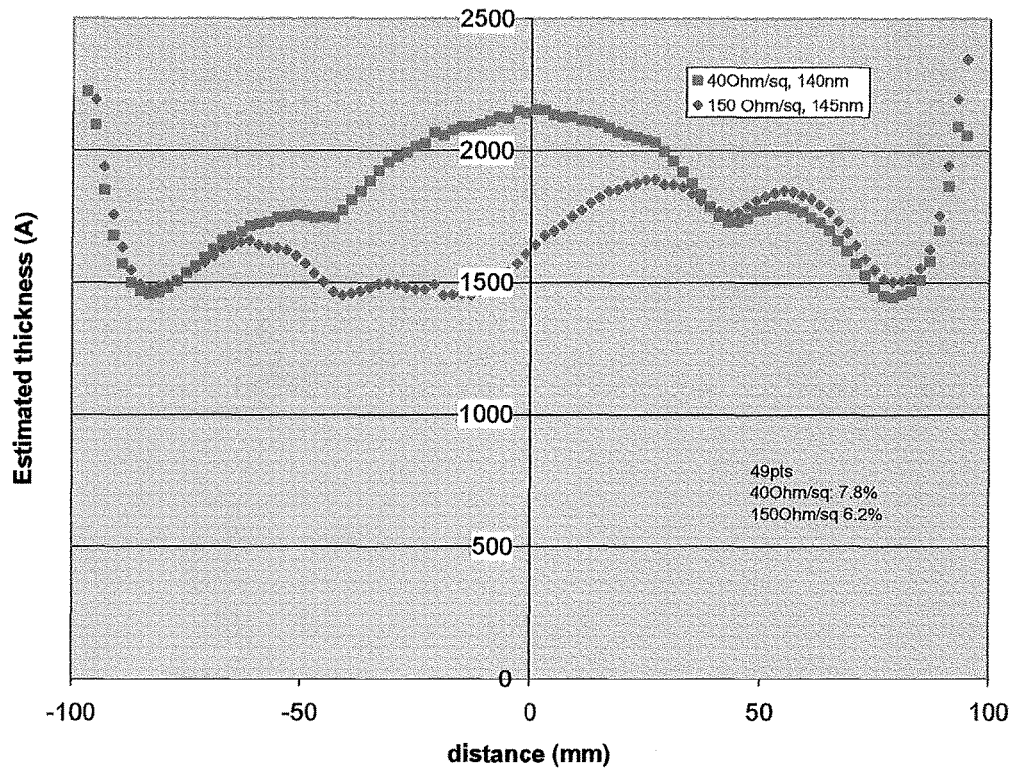
FIG. 6 shows the resistance profile of Cu plated directly on a TiN barrier of varying resistance where not only is the overall uniformity hard to control, but there is also always a center edge difference which gets increasingly worse at higher barrier resistance.
Figure 7:
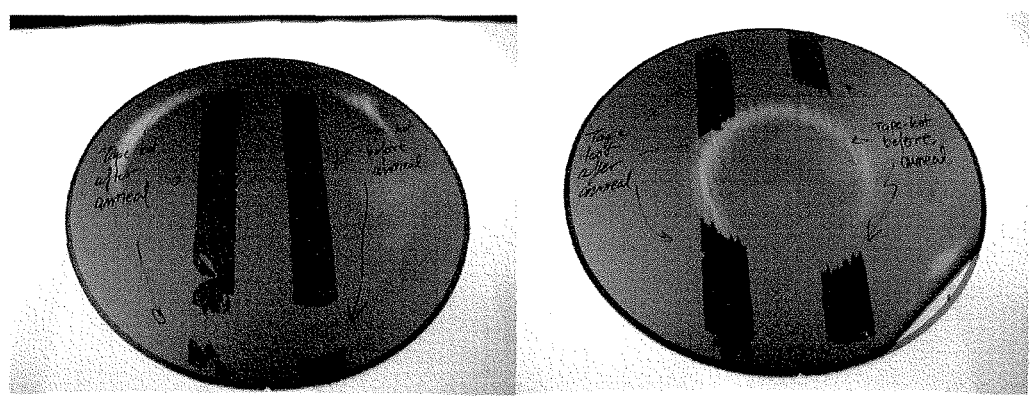
FIG. 7 is a photograph that shows the results of tape pull tests the plated Cu on bare barrier wafer, a tape pull test was applied to check adhesion where given the varying center to edge over-potential of conventional means, (only a portion of the wafer can be optimized for good adhesion in this case either the center region or the wafer edge region, but not the entire wafer)

Referring now to FIG. 1B, there is shown a copper damascene structure where the microscale feature 100 etched into substrate 103 has dimensions of 500 to 2000 angstroms in width or diameter 104 and 5000 to 30,000 angstroms in depth 106. To avoid significant potential difference variation across a 300 mm silicon substrate a copper seed layer thickness of at least about 1000 angstroms, but which may range to about 5000 angstroms in thickness, may be employed corresponding to sheet resistivities of from about 0.20 to 0.04 ohms/square. As shown in FIG. 1B, a 1000 angstrom seed layer 122 deposited using PVD into a 2000 angstrom wide feature will cause the hole to be "pinched-off" before there is coverage of the seed layer along the entire interior surface of the microscale feature. Referring now to FIG. 1C and for these type of applications, an "ultra-thin" seed layer 102, which may be only 100-250 angstroms in thickness may be deposited. As may be realized, such a thin seed layer has resistivity in the range of 4 ohms per square. As described in U.S. patent application Ser. No. 11/050,899 by Vereecken which is hereby incorporated by reference herein in its entirety, and depicted in FIG. 2 curve 300, this level of substrate resistivity causes a substantial difference in deposition overpotential between the wafer perimeter and the wafer center, as much as 100 fold reduction in deposition overpotential from perimeter to center. FIG. 7 is a photograph that shows the results of a tape test of such Cu plated on a blanket TiN barrier wafer. As may be realized from FIG. 7 the system may be adjusted to maintain either good center or edge adhesion. The plating tool geometry may otherwise be modified to provide a non-uniform applied electric field to compensate for the spatially non-uniform overpotential; for example by a means such as multiple anode segments as described in U.S. Pat. No. 6,497,801 to Woodruff and U.S. Pat. No. 6,773,571 to Mayer, all of which are hereby incorporated by reference herein in their entirety, or by a means such as disposing a highly resistive porous plate between the anode and the substrate such as the Ebara Corporation "EREX" system. The deposition overpotential strongly influences the adhesion of the deposited film, primarily due to the influence of the overpotential on the deposit nucleation density. Where uniform deposition can be achieved for a particular sheet resistance wafer, it may need to be re-adjusted when there is a change in the barrier resistance. FIG. 6 shows the same process applied to two different barrier resistance.

Figure 3:
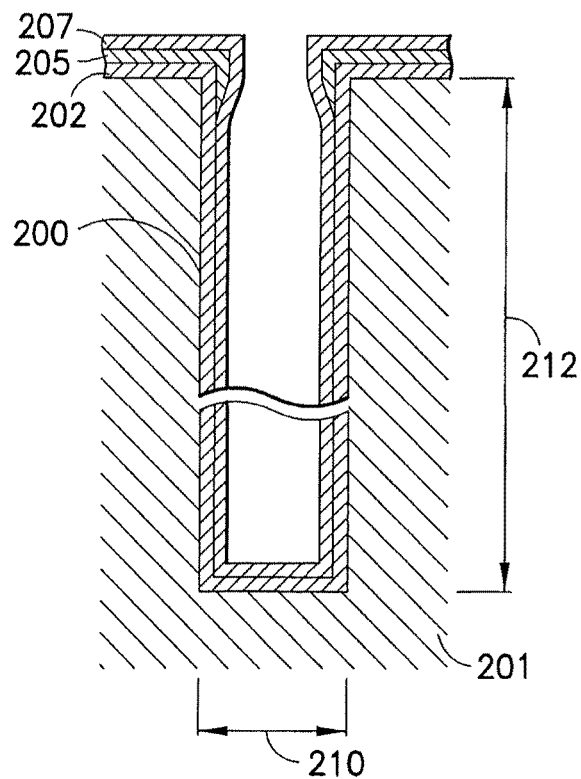
FIG. 3 depicts cross sectional view of the present disclosed embodiments.

Referring again to FIG. 2, the curve 302 depicts the deposition overpotential of the present disclosed embodiments, showing that a substantially uniform overpotential is provided by the method of applying a relatively thick conductive metal coating to the planar surface of the substrate. Referring also to FIG. 3, the present disclosed embodiment is depicted in cross section as a microscale feature hole 200 fabricated into substrate 201 with the hole for example being in the range of diameter or width 210 of from about 1 to 10 microns (about 10,000 to 100,000 angstroms) and depth 212 of from about 10 to 100 microns (about 100,000 to 1,000,000 angstroms), a exemplary microscale feature being circular with a diameter of 5 microns (50,000 angstroms) and a depth of from 50 to 75 microns (500,000 to 750,000 angstroms). As may be realized, the microscale feature 200 shown in FIG. 3 is representative, and features similar to feature 200 may be located as desired anywhere on the substrate 201. The substrate, along with the microscale features, may be coated with an insulating film (not shown) and may then be coated with a metal barrier film 202 by a process providing coverage that is substantially independent of the microscale geometry, exemplary processes being chemical vapor deposition (CVD) of titanium nitride, tantalum nitride, ruthenium or tungsten, or electroless chemical deposition of nickel, said barrier film having for example an electrical resistivity of from about 1 ohms/square to 200 ohms/square, exemplary process being from about 5 to 50 ohms/square.

The exemplary embodiments, as will be described further below provide for deposition of a well adhered and electrically conductive coating 205, for example, using physical vapor deposition (PVD) of copper in the range of about 0.1 to 0.5 microns (1000 angstroms to 5000 angstroms) thick. The PVD copper layer may be deposited in the same machine (not shown) as the CVD barrier if said machine is capable of moving the substrate from the CVD chamber to the PVD chamber without causing oxide growth on the barrier which would degrade the adhesion of copper to barrier. In alternate embodiments, the PVD copper layer may be deposited in a separate machine using known methods of a plasma pre-clean etch to remove oxides from the barrier layer and providing a PVD sputtered adhesion layer followed by a thick PVD sputtered copper layer, (for example, in an embodiment being about 1000 angstroms of titanium and about 2000 angstroms of copper) though in alternate embodiments the barrier and connecting layer may have other respective suitable thicknesses. As depicted in FIG. 3 the PVD conductive layer 205 is substantially uniform and continuous and does not substantially or appreciably coat the interior surfaces of the microscale features 200 of high aspect ratio (e.g. AR>5). In the exemplary embodiments, microscale features 200 may have depth to diameter aspect ratios of from about 5 to 15. It is noted that conventional ionized PVD systems are capable of coating interior surfaces of microscale features up to aspect ratio of 10, however these conventional systems are very expensive to operate. In contrast, the exemplary embodiments may provide an economical alternative to the ionized PVD method, and may operate effectively to include microscale features with aspect ratio substantially greater than 10.

Figure 4:
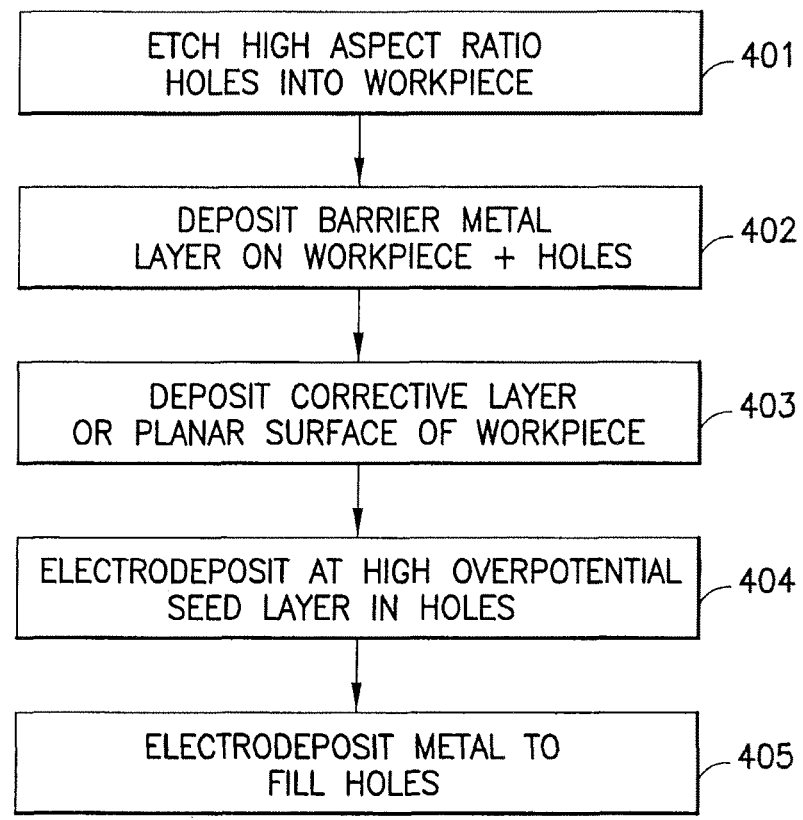
FIG. 4 is a flow diagram of the present disclosed embodiments.
Figure 5:
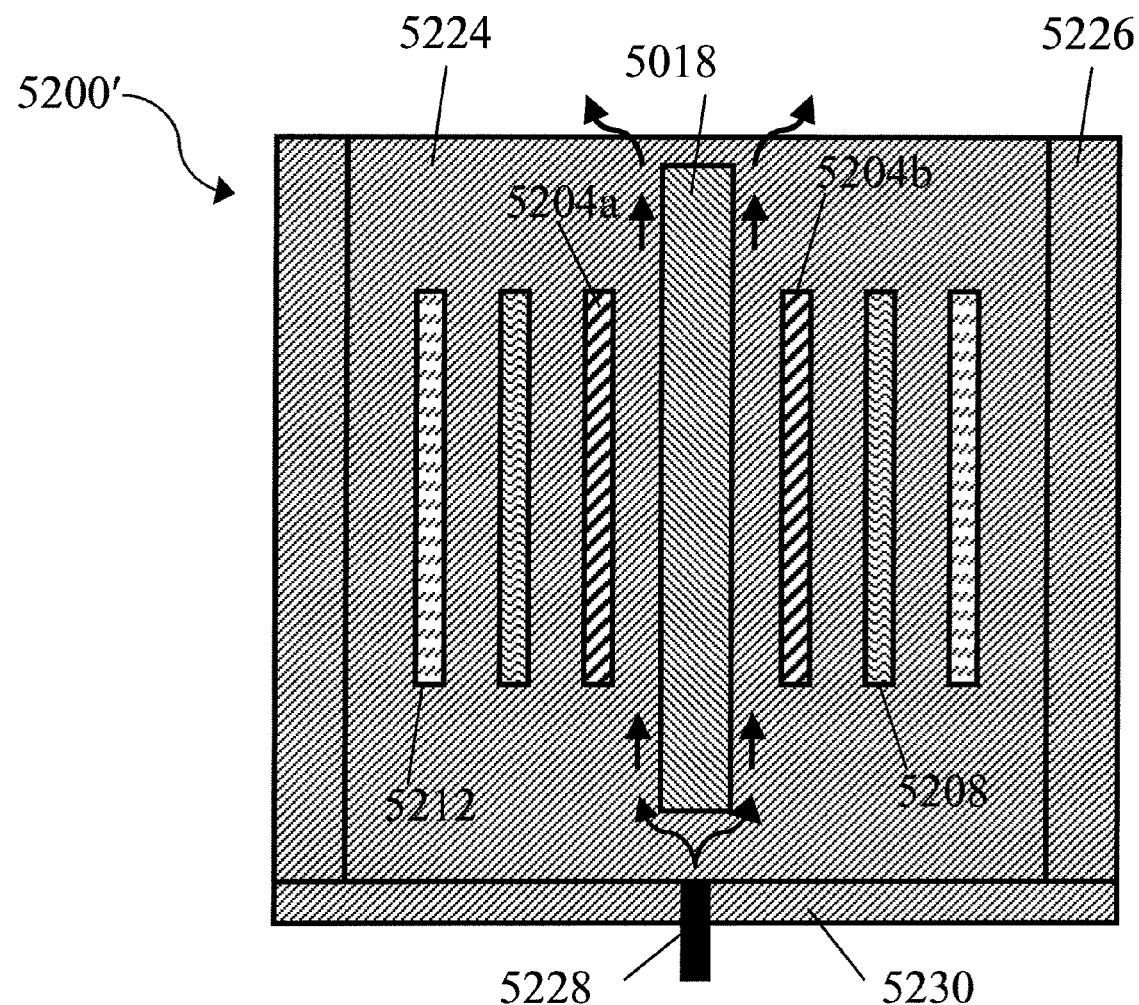
FIG. 5 is a schematic of an electroplating process cell suitable for use in the present disclosed embodiments.

Referring now to FIG. 4, there is shown a flow chart graphically illustrating a method in accordance with the exemplary embodiments disclosed herein for effecting electrodeposition of an adherent seed layer 207 (see also FIG. 3) by virtue of the conductive layer providing microscale uniformity of the deposition overpotential applied to each of the microscale features. Accordingly, a feature 200 at the center of the substrate is supplied with a similar overpotential to a feature 200 at the substrate perimeter. This may be achieved with commercially available single anode electroplating equipment such as the "Stratus" from NEXX Systems Incorporated. FIG. 5 is a schematic cross sectional view of an exemplary apparatus for effecting at least part of the process illustrated in the chart of FIG. 4. This embodiment can be used, for example, to process two workpieces simultaneously, for instance held by dual sided workpiece holder(s) 5018, though in alternate embodiments, the apparatus may be configured to process but a single workpiece. Generally, the apparatus may have a housing 5200' that includes a side wall 5224 and end walls 5226, and the relative positioning of agitation members 5204a and 5204b (e.g. shear plates), plates 5208 and anodes 5212 is shown. These elements or the distances are not shown to scale. Although the members 5204a and 5204b are shown as two separate structures, they can form a single assembly. A similar apparatus is described in U.S. patent application Ser. No. 12/702,860 filed Feb. 9, 2010, and incorporated by reference herein in its entirety.

In the embodiment shown, fluid enters the housing 5200' through at least one port 5228 in a bottom wall of the housing 5200'. The port 5228 can, in some embodiments, be located in a center portion of the bottom wall 5230 of the housing 5200'. In one embodiment, the port 5228 can be positioned in a bottom portion of a side wall 5224. The fluid flows up along the surfaces of the one or more workpieces. The fluid can flow between the workpiece holder 5018 and the respective member 5204, 5204a, or 5204b or between the workpiece holder 5018 and the plate 5208. In various embodiments, the fluid exits the housing 5200' through the top of the housing, through a top portion of a side wall 5224, or through a top portion of an end wall 5226. Arrows show the general direction of flow.

In the exemplary embodiment, the anode 5212 may form the outer wall of the housing 5200. In one embodiment, the anode 5212 can be a component of an anode assembly, which forms the outer wall of the housing 5200. In various embodiments, the housing 5200 has an outer wall and either the anode 5212 or the anode assembly are removably attached the wall or spaced from the wall.

In the exemplary embodiment, the anode 5212 may be a copper disk. In one embodiment, the exposed surface area of the anode 5212 is about 300 cm2. In one embodiment, the anode 5212 is consumed during electrodeposition (or another fluid process such as copper or solder deposition). One feature of the anode 5212 is that it can be removed and replaced with little effort, minimizing lost production time.

As may be realized, in the exemplary embodiments using an anode 5212, the workpiece surface serves as the cathode. Referring again to FIG. 4, it may be understood that in the exemplary embodiment etching of the high sheet ratio holes (TSV) into the workpiece 201 (see also FIG. 3) as identified in block 401 of FIG. 4 may be performed outside or prior to placement of the workpiece in the electroplating apparatus. Similarly, the deposition as described previously of the barrier layer 202 and thick conductive layer 205, respectively identified in blocks 402-403 of FIG. 4, may be performed outside or prior to placement of the workpiece in the electroplating apparatus. As noted before and seen best in FIG. 3, the thick conductive layer 205 deposited on the workpiece surface, is substantially uniform in thickness across the surface of the workpiece where the conductive layer 205 is deposited. The conductive layer 205 is also substantially continuous, where deposited, with no appreciable voids or discontinuities interrupting the conductive layer (e.g. no appreciable portions of the deposited conductive layer 205 are isolated from other portions of the conductive layer). As seen best in FIG. 3, in the exemplary embodiment, but for a small (scale comparable to coating thickness itself) portion of the hole inner wall surface, at the topmost opening, the hole wall surface remains uncoated (has no appreciable conductive layer deposits) with the conductive layer. Electrodeposition of the adherent seed or finish layer 207, block 404 in FIG. 4, may be performed as noted before with the electrodeposition apparatus illustrated in FIG. 5, fully coating the workpiece surface, including that of the TSV(s) inner walls that lack any appreciable coating or deposits of a Cu PVD conduction layer. As noted before, the seed or finish layer 207 is coated, per block 404 in FIG. 4, directly onto the barrier layer 202 on the inner walls of the TSV. In the exemplary embodiments, the finish or seed layer 207 may be formed (from the surface on which the seed layer is being deposited) to a desired final thickness of the seed layer in substantially one (deposition) step. As seen in FIG. 3, the finish coat 207 is but one layer providing the finish surface upon which the fill process may be applied, block 405 of FIG. 4. As may be realized, the apparatus in the exemplary embodiment shown in FIG. 5, may also include a suitable controller (not shown) connected to the described components and adapted to operate the apparatus and effect the corresponding portions of the process show in FIG. 4 and described herein.

Figure 8A:
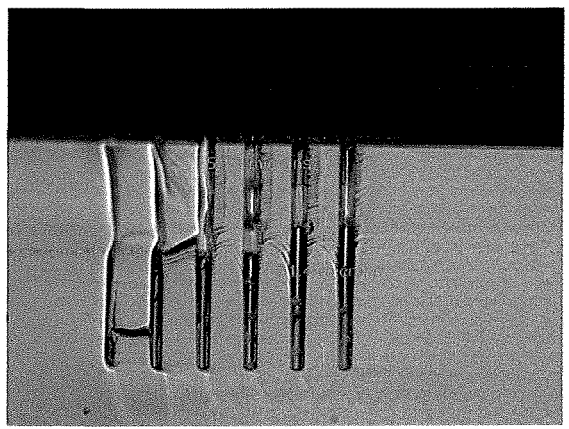
FIG. 8 (*a*) is a photograph that shows a via filled without having a conductive Cu PVD layer, (the nucleation failed to reach towards the via bottom) and FIG. 8 (*b*) is another photograph that shows results of a via filled using a system and process flow according to the exemplary embodiments, in this case resulting from the use of a conductive Cu PVD layer, generated in accordance with the disclosed embodiments, and where good Cu nucleation exists as evident from a solid fill can be observed throughout the via.
Figure 8B:
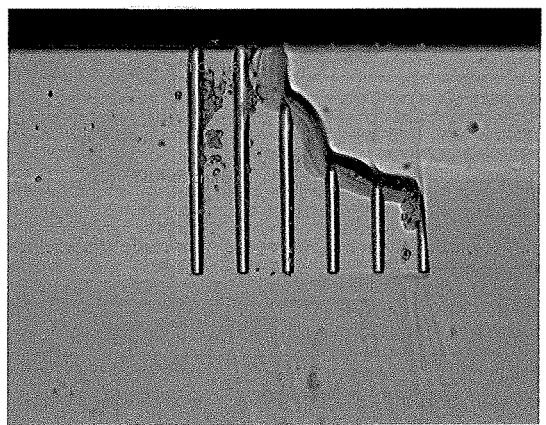

As has been described previously, in the exemplary embodiments, the thick copper layer removes the highly resistive characteristic of the substrate, as otherwise would exist for either a "direct on barrier" or "ultra-thin seed layer" type of substrate and provides a substantially uniform electrical conduction capability to all the microscale features located throughout and across the workpiece. Hence, it is possible to use a method that may be referred to as a so called "strike" process, wherein use of a chemical bath dilute in ions is combined with application of a high electrical overpotential to generate dense nucleation thereby providing an adherent deposit. A suitable example of a "strike" bath is disclosed by Shaw in U.S. Pat. No. 3,684,666 which is hereby incorporated by reference herein in its entirety. In the exemplary embodiment, the strike process may use an alkaline solution containing about 96 grams per liter of citric acid, 20 grams per liter of $CuCO_3Cu(OH)_2$, with pH adjusted to about 11.6 by addition of NaOH operating at a current density of 4 amperes per decimeter. Referring also to FIGS. 8a-8b there is shown optical images of a cross-section of actual plated vias with and without the Cu PVD conduction layer. The sample was cleaved to expose the Cu-barrier interface of the via to the wafer. The image on the left side FIG. 8(a) shows similar process on a TiN barrier only, versus the right side FIG. 8(b) which includes the addition of the Cu PVD conduction layer in accordance with the exemplary embodiments as described herein. As may be seen, the plated Cu failed to reach all the way to the via bottom in FIG. 8(a). Adhesion test using a tape pull procedure revealed that the sample in FIG. 8(a) could easily be lifted-off, where as the sample in FIG. 8(b) had no such problems.

The disclosed embodiments provide important advantages relative to the prior-art, for example U.S. Pat. No. 7,115,196 seed layer enhancement method and apparatus, because it provides a wide process operating window that facilitates an economical manufacturing process. Referring also to FIG. 6, there is shown an illustration of the thickness profile of copper films plated directly on high resistance substrate in a conventional manner using a multi-zone anode electroplating configuration similar to that described in U.S. Pat. No. 7,115,196. Although thickness uniformity is better then that achieved without anode zone control, there is metal thickness variation which is also indicative of variation in the nucleation and consequent adhesion of the copper film. As noted before, FIG. 7 illustrates conventionally plated Cu wafers directly on barrier after being subjected to a tape-pull test to test for adhesion. As shown, in conventional systems employing anode zone control, consistent and uniformly adherent plating is difficult to achieve resulting in either the center or edge region deposit in a condition that provided adequate adhesion (while the other portions of the substrate as shown were deposited in a low adhesion condition). The exemplary embodiments circumvent this problem by limiting the required control of nucleation and adhesion of copper on the barrier to the geometrical scale of the through silicon via itself. In other words the disclosed embodiments reduces the problem from controlling potential across the 300 mm surface of a typical silicon substrate to controlling the potential across the depth of a 0.1 mm deep microscale feature, thereby simplifying the problem by several orders of magnitude.

After the one layer finish or seed layer 207 has been deposited to a sufficient thickness inside the microscale feature, for example a minimum thickness of about 200 to 500 angstroms, the substrate may be moved to a conventional "bottoms-up" type of electroplating bath (block 405 in FIG. 4), for example DVF200 by Enthone Incorporated. Copper is electrochemically filled into the microscale feature by methods well known in the arts. In the exemplary embodiment, the workpiece may not be annealed between the seed layer deposition and the subsequent filling deposition because the present disclosed embodiments advantageously assures reliable adhesion between barrier and seed on the planar surface of the substrate due to the well known adhesive properties of the PVD applied conductive layer. Adhesion between barrier and seed layers on surfaces inside the TSV may be improved for example during annealing after filling the TSV. The compressive stress generated across the interface by the thermal expansion of the copper inside the microscale feature hole relative to the substrate expansion serves to improve the adhesion between the microstrike applied copper and the barrier material (e.g. substrate may be silicon which has a thermal expansion coefficient of approximately 4 ppm/C compared to that of copper which is 18 ppm/C).

In the exemplary embodiment(s) the grain structure and adhesion of the seed layer deposition inside the microscale feature during the strike bath may be influenced by applying the deposition potential in pulses. Specifically a positive voltage is applied to the substrate, or cathode, for a time period of from 10 to 100 milliseconds which is followed by an off period, with no voltage applied, of from 20 to 1000 milliseconds. For example, the off/on period ratio is may be about 2:10, more specifically an off/on time period ratio of 1:4 may be used. In the exemplary embodiment(s), once a continuous Cu layer is formed all the way to the bottom of the via, the current is then reduced to optimize the grain structure of the Cu layer to support growth of a fine grain structure of the electrodeposited Cu filling material in the next step.

In one embodiment, a method for coating the interior surfaces of microscale hole features fabricated into the substantially planar surface of the workpieces provided. The method comprises providing a workpiece with a barrier metal coating that is substantially continuous and uniform both along the planar surface of the workpiece and the inner surfaces of the microscale hole features wherein said barrier metal coating is applied by a substantially surface reaction limited process, providing the workpiece with a coating, on the planar surface of the workpiece, of a thick metal layer anchored to the barrier metal coat and disposed to provide substantially uniform electrical conduction capability to the microscale features located throughout and across the workpiece, providing an electrical contact path to the electrically conductive coating at the perimeter of the workpiece, immersing the workpiece and in a chemical bath and causing said chemical bath to fully contact the interior surfaces of the microscale hole features, said chemical bath containing metal ions suitable for electrodeposition, and applying electric potential at the perimeter of the workpiece to cause electrodeposition of metal ions onto all surfaces of the workpiece including the interior surfaces of the microscale hole features forming a predetermined finish coat in one electrodeposition step. In another embodiment, a semiconductor workpiece processing apparatus for manufacturing microscale hole structures in workpieces is described. The work piece has a barrier film applied to a planar surface and interior surfaces of microscale hole structures of the workpiece and having a metal layer deposited over and anchored to the barrier film. The apparatus has a housing defining a process chamber for the workpiece. The chamber is configured for pre wetting the workpiece with a processing fluid that forms a fluid to metal surface interface between the processing fluid and the planar surface and interior surfaces of each microscale hole structures of the workpiece An anode is located inside the chamber for electroplating the workpiece, the anode being arranged so that an electroplating overpotentialis generated between the workpiece and anode that is substantially uniform across the workpiece which effects electrodeposition of metal on the planar surface and interior surfaces of each microscale hole structure of the workpiece so that the interior surfaces of each micro scale hole structure have a finish coat that is a one layer coat.

It should be understood that the foregoing description is only illustrative of the invention. Various alternatives and modifications can be devised by those skilled in the art without departing from the invention. Accordingly, the present invention is intended to embrace all such alternatives, modifications and variances that fall within the scope of the appended claims.

What is claimed is:

1. A method for coating and filling the interior surfaces of microscale hole features fabricated into a surface of a workpiece, the method comprising:
   providing a workpiece with a barrier metal coating that is substantially continuous along the surface of the workpiece and the interior surfaces of the microscale hole features;
   providing a first conductive coating after the providing of the barrier metal coating, wherein the first conductive coating has a thickness of 1000 angstroms or greater on a top surface of the workpiece and wherein the first conductive coating does not substantially coat the interior surfaces of the microscale hole features;
   providing a second conductive coating by electrodeposition, wherein the first conductive coating provides substantially uniform electrical conduction across the workpiece for electrodeposition of the second conductive coating, and wherein at least part of the second conductive coating is formed on and in contact with the first conductive coating, and further wherein the second conductive coating is deposited on interior surfaces of the microscale hole features directly on the barrier metal coating and provides a finish coating for subsequent filling of the microscale hole features; and
   filling the microscale hole features with a conductive metal.

2. The method of claim 1, wherein the first conductive coating is formed by a vapor deposition process, and wherein the filling of the microscale hole features with a conductive metal is performed with an electrodeposition process.

3. The method of claim 2, wherein the first conductive coating comprises copper, the second conductive coating comprises copper, and the conductive metal filling the microscale hole features comprises copper.

4. The method of claim 1, wherein the second conductive coating is deposited by a first electrodeposition process, and wherein the microscale hole features are filled with the conductive metal by a second electrodeposition process performed subsequent to the first electrodeposition process.

5. The method of claim 4, wherein the second conductive coating provides an adherent seed layer for the subsequent filling of the microscale hole features during the second electrodeposition process.

* * * * *